United States Patent [19]
Okabayashi et al.

[11] Patent Number: 5,308,792
[45] Date of Patent: May 3, 1994

[54] METHOD FOR FABRICATING SEMICONDUCTOR DEVICE

[75] Inventors: Hidekazu Okabayashi, Tokyo; Shoichi Endo, Kyoto, both of Japan

[73] Assignee: NEC Corporation, Tokyo, Japan

[21] Appl. No.: 925,168

[22] Filed: Aug. 6, 1992

[30] Foreign Application Priority Data

| Aug. 6, 1991 | [JP] | Japan | 3-196322 |
| Aug. 6, 1991 | [JP] | Japan | 3-196323 |
| Aug. 6, 1991 | [JP] | Japan | 3-196324 |

[51] Int. Cl.⁵ ............................................. H01L 21/44
[52] U.S. Cl. ................................... 437/180; 437/182; 437/183; 437/192; 437/193; 437/228
[58] Field of Search ............... 437/180, 192, 193, 200, 437/225, 228, 182, 183

[56] References Cited

U.S. PATENT DOCUMENTS

| 4,171,996 | 10/1979 | Maslov et al. | 437/901 |
| 4,348,746 | 9/1982 | Okabayashi et al. | 437/193 |
| 4,551,908 | 11/1985 | Nagasawa et al. | 437/59 |
| 4,558,507 | 12/1985 | Okabayashi et al. | 437/200 |
| 4,585,491 | 4/1986 | Burnham et al. | 437/247 |
| 4,671,846 | 6/1987 | Shimbo et al. | 437/225 |
| 4,939,101 | 7/1990 | Black et al. | 437/62 |

*Primary Examiner*—Brian E. Hearn
*Assistant Examiner*—Kevin M. Picardat
*Attorney, Agent, or Firm*—Burns, Doane, Swecker & Mathis

[57] ABSTRACT

A method for fabricating a semiconductor device comprises the steps of depositing a metal film for forming interconnections and/or electrodes on an insulating film formed on a substrate and then applying a hydrostatic pressure exceeding atmospheric pressure to the deposited metal film; or comprises the steps of forming a passivation film on a metal film for forming interconnections and/or electrodes, which is formed on a substrate with an insulating film, and then applying a hydrostatic pressure exceeding atmospheric pressure to the passivation film formed. The method makes it possible to substantially improve density and adhesion of the metal film and the insulating film and to produce semiconductor devices equipped with high-quality electrodes or interconnections at a relatively low cost.

21 Claims, 3 Drawing Sheets

METHOD FOR FABRICATING SEMICONDUCTOR DEVICE

BACKGROUND OF THE INVENTION

1. Field of the Invention

The present invention relates to a method for fabricating a semiconductor device, and in particular a method for fabricating a semiconductor device provided with interconnections or electrodes having high reliability. The present invention also relates to a method for producing interconnections, electrodes and insulating films which are of high density and firmly adhered to an underlying layer.

2. Description of the Prior Art

Metal films for forming interconnections or electrodes and insulating films for semiconductor devices have been deposited through a variety of methods such as the vacuum evaporation method, sputtering method and CVD method under a reduced pressure or atmospheric pressure. Such metal films formed on the substrate is then patterned into patterns for interconnections or electrodes, thereafter a passivation film is formed thereon to insulate and passivate the resulting interconnections or electrodes and to thus complete the semiconductor device.

Such metal and insulating films deposited on the underlying film under a reduced pressure or atmospheric pressure often have lower density or is not always sufficiently adhered to the underlying films. This becomes a cause of stress migration and electromigration, in particular, for fine interconnections, for instance, on the order of about 0.6 to 1.5 $\mu$m and for thin interconnections, for instance, on the order of about 0.5 $\mu$m, which occur as the degree of integration of LSI's increases. Accordingly, the density of films for interconnections, electrodes and insulating layers and the adhesion thereof to the underlying film greatly affect the yield of semiconductor devices and the reliability of the resulting interconnections. Therefore, this is an important problem to be solved in the fabrication of semiconductor devices.

For instance, it has been believed that the reduction in reliability of aluminum (Al) interconnections for IC's due to stress migration and electromigration results from low density of an Al film and insufficient adhesion thereof to an underlying film and a passivation film. It has likewise been believed that insufficient adhesion between a silicide layer and a polycrystalline silicon layer which constitute a two-layered structure (a polycide structure) used for forming interconnections and gate electrodes of semiconductor devices leads to peeling off or delaminating of the silicide film during a high temperature annealing process. It has been widely recognized that low-density insulating films cause corrosion of interconnections and instability of devices due to contaminants. These become a severe obstacle for the development of high quality semiconductor devices.

In general, a barrier layer of, for instance, titanium nitride is applied between Al interconnections and a silicon (si) substrate in order to prevent alloying reaction between Al and Si. The Si substrate and Al layers must be firmly adhered to such a barrier layer in order to obtain good barrier properties of the latter and lower contact resistance. For this reason, it is very important to develop a method for forming metal films having a high density and sufficient adhesion of the metal film to an underlying film for improving the yield of semiconductor devices and the reliability of interconnections.

SUMMARY OF THE INVENTION

Accordingly, an object of the present invention is generally to solve the foregoing problems of the conventional technology concerning the yield of semiconductor devices and the reliability of interconnections and electrodes thereof and more specifically to provide a method for fabricating a semiconductor device provided with novel interconnections and electrodes which are formed with high-density metal films and satisfactorily adhered to an underlying high-density layer and a high-density passivation film.

According to an aspect of the present invention, there is provided a method for fabricating a semiconductor device which comprises the steps of depositing a metal film for forming interconnections and/or electrodes of a semiconductor device on an insulating film formed on a substrate and then applying a hydrostatic pressure which exceeds atmospheric pressure to the surface of the deposited metal film to improve adhesion between the metal film and the insulating film.

According to another aspect of the present invention, there is provided a method for fabricating a semiconductor device which comprises the steps of forming a passivation film on a metal film for forming interconnections and/or electrodes of a semiconductor device, which is formed on a substrate and passivated with an insulating film, and then applying a hydrostatic pressure which exceeds atmospheric pressure to the surface of the resulting passivation film to increase the density of and firmly adhere the passivation film and the insulating film to the metal film.

DESCRIPTION OF THE PREFERRED EMBODIMENTS

Figure 1:
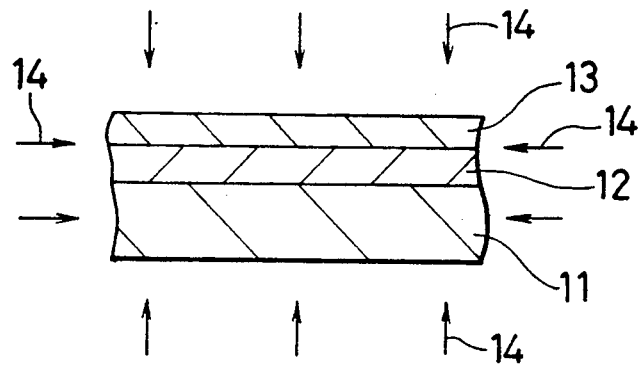
FIG. 1 is a schematic cross-sectional view showing a part of a semiconductor device under fabrication and given for explaining the outline of the process for forming interconnections fabricated with higher density Al according to a first embodiment of the method of the present invention.

The method for fabricating a semiconductor device according to the present invention will be explained in more detail below.

In the method of the present invention, the metal films formed are used for forming electrodes and interconnections for semiconductor devices and examples thereof include films of metals such as silicon, aluminum, chromium, copper, platinum, gold, titanium, zirconium, molybdenum, tungsten, tantalum and alloys thereof; silicides of metals such as titanium, zirconium, hafnium, vanadium, tantalum, chromium, molybdenum, tungsten, iron, cobalt, nickel, platinum and palladium; and any combination of at least two of them.

In the present invention, a metal film is formed on an insulating film lying on a substrate by depositing a metallic material by any conventional manner, but the substrate provided thereon with the deposited metal film is compressed by the application of hydrostatic pressure higher than atmospheric pressure after the deposition of the metal film. The magnitude of the hydrostatic pressure varies depending on the heating temperature during process, but it is generally higher than atmospheric pressure and preferably a pressure higher than 100 MPa.

In the method of the present invention, a hydrostatic pressure is employed in order to uniformly press the whole substrate on which a metal film is formed and to thus sufficiently adhere the metal film to the underlying film and densify the whole metal film. Accordingly, there can be formed, for instance, a high-density metal film sufficiently and firmly adhered to the underlying layer without causing any damage in the resulting interconnections and electrodes.

This process of applying a hydrostatic pressure may likewise be performed preferably after patterning the metal film into patterns of interconnections and electrodes. In this case, the entire patterns of the interconnections and electrodes can be uniformly and sufficiently adhered to the underlying layer and further microscopic defects caused on the surface of the interconnection and electrode patterns during patterning of the same can be recovered.

In the method of this invention, the metal film deposited on a substrate with an insulating film according to a variety of methods such as the CVD method is formed into patterns of interconnections and/or electrodes and then a passivation film or an insulating film is deposited onto the patterns (inclusive of the insulating film). In this case, the application of hydrostatic pressure is preferably performed after forming of the passivation film since the interconnection and electrode patterns can be satisfactorily adhered not only to the passivation film but also to the underlying insulating layer.

According to the method of the present invention, when a semiconductor device comprises a plurality of interconnection layers, all the plurality of interconnection layers are first formed and then a hydrostatic pressure is applied to the resulting assembly to thus firmly adhere the interconnection and electrode patterns in different interconnection layers to one another and to firmly adhere these patterns to the neighbouring underlying and interlayer insulating films.

The application of hydrostatic pressure can be performed every time when a metal film or a pattern of an interconnection or an electrode in one or some of a plurality of interconnection layers is formed, or every time when an insulating film is formed on the metal film or the interconnection or electrode pattern. In any case, it is possible to ensure satisfactory adhesion of the metal film for the interconnection layer, the interconnection or electrode pattern to the underlying insulating film or the interlayer insulating film.

The term "passivation film" herein used means an insulating film of semiconductor devices which is formed according to passivation technology in the art and further used in its broad sence, including an interlayer insulating film.

For example, the passivation film used in the present invention may be a variety of protective films conventionally used for semiconductor devices, for instance, resin films for resin seal, and a variety of known insulating films which are used as interlayer insulating films and make the semiconductor devices inactive with respect to contaminants such as water and ions, e.g. $SiO_2$, $PSG(P_2O_5.SiO_2)$, $BPSG(B_2O_3.P_2O_5.SiO_2)$, $PSG/SiO_2$, silicon nitride ($SiN_x$), $SiN_x/PSG$ and silicon oxynitride ($SiOxNy$) films or the like.

In the method of the present invention, the application of hydrostatic pressure is carried out by positioning a substrate, on which a metal film, an electrode pattern and/or an interconnection pattern are formed, or a semiconductor device in gas or liquid for a pressure medium and then increasing the pressure of the gas or liquid up to a desired level by the known methods, such as hot isostatic pressing (hereinafter referred to as HIP). If heating is performed in this case, it is preferred that the application of hydrostatic pressure is first started and then the heating is started during the course of pressing or after increasing the pressure up to a desired level.

In the present invention, the pressure media used for the application of hydrostatic pressure are gases such as argon gas, nitrogen gas, oxygen gas or the like, or a mixture of these gases for the pressure up to 300 MPa. Gases for these pressure media can be appropriately selected depending on the properties of a specific metal or insulating film chosen.

The hydrostatic pressure used for pressing the metal, insulating and passivation films as well as semiconductor devices provided with these films is determined depending on the heating temperature according to the present invention. In general, if the heating temperature is lower, a higher hydrostatic pressure is applied, while if the heating temperature is higher, the hydrostatic pressure is set to a relatively low level. For instance, the results of high temperature stress migration (stress induced voiding) test which comprises heating a test sample to a temperature ranging from 450° to 500° C. for 30 minutes and then allowing to cool to inspect interconnections for voids formed therein indicate that the rate of void formation due to the high temperature stress migration within an interconnection layer for a semiconductor device observed at a heating temperature of 400° C. is lower than that observed at a heating temperature of 200° C. when the hydrostatic pressure during the heating and compressing process is set to 200 MPa, and further if the heating temperature is set to 400° C., the rate of void formation observed at a hydrostatic pressure of 300 MPa is lower than that observed at a hydrostatic pressure of 200 MPa.

According to the present invention, a metal film is deposited on an insulating layer formed on a substrate and then a hydrostatic pressure exceeding atmospheric pressures is applied onto the surface of the deposited metal film. This can, accordingly, uniformly densify the metal film for forming electrodes and interconnections deposited on the insulating layer which is formed on the substrate, and this can likewise ensure strong adhesion of the metal film to the underlying insulating film. Thus, high-quality interconnections and electrodes can be obtained according to the present invention.

When a hydrostatic pressure is applied after the deposited metal film is formed into a desired pattern of an interconnection or an electrode, the interconnection or electrode patterns thus formed are uniformly increased in density by the hydrostatic pressing, microscopic defects in the interconnections and electrodes formed during the pattern-formation can be recovered and the patterns are firmly adhered to the underlying insulating film. Thus, high-quality and highly reliable interconnections and electrodes can be produced in a high yield.

According to another aspect of the present invention, a hydrostatic pressure exceeding atmospheric pressure is applied to a whole substrate after the formation of a passivation film such as an insulating film on interconnections or electrodes which are formed on the substrate with an insulating film lying thereon. For this reason, all of the exposed insulating films and metal films are uniformly pressed by the hydrostatic pressure and thus they are increased in density. Moreover, microscopic defects on the patterned surface caused during the pattern-formation can be recovered through the application of the hydrostatic pressure. These effects ensure a high yield of these interconnections and electrodes. Further, The tensile stress in each film may be reduced by the application of hydrostatic pressure. Thus, high-quality and highly reliable semiconductor devices can be fabricated in a high yield.

The method of the present invention will be explained in more detail with reference to the following embodiments, but the present invention is by no means limited to the following specific examples and description.

EXAMPLE 1

This Example relates to a first embodiment according to the present invention shown in FIG. 1, which is a schematic cross-sectional view showing a part of a semiconductor device under fabrication and given for explaining the outline of the process for forming a densified Al interconnection. A thin Al film 13 for forming interconnections was deposited on an insulating film 12 formed on a substrate 11 according to a standard method for producing an integrated circuit. The substrate 11 provided thereon with the thin film 13 was introduced into a pressure chamber of a standard HIP apparatus (not shown) and a hydrostatic pressure 14 equal to 200 MPa was applied thereto using an argon as a pressure media and the substrate 11 was heated to 400° C. The Al thin film 13 formed on the substrate 11, which was heat-treated under hydrostatic pressure, was patterned into the interconnections according to a standard process and passivated with a two-layered film comprising $SiN_x$/PSG, and thereafter subjected to a high temperature stress migration test in order to inspect the interconnections for the formation of voids, i.e. heated to a temperature ranging from 450° to 500° C. for 30 minutes at atmospheric pressure, then allowed to cool. As a result, only a small number of voids was observed.

EXAMPLE 2

Figure 2A:
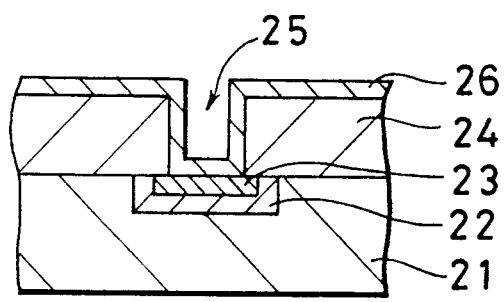
FIGS. 2A and 2B are schematic cross-sectional views each showing a part of a semiconductor device, under fabrication, which is provided with a barrier layer of titanium nitride (TiN) and given for explaining the outline of the process for forming ohmic contacts according to a second embodiment of the method of the present invention.
Figure 2B:
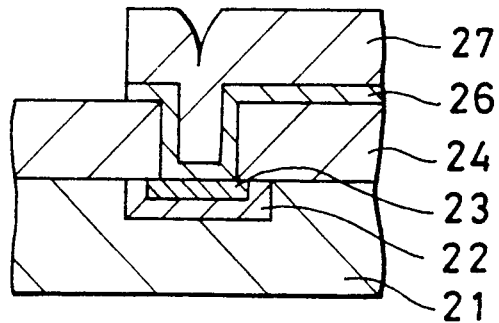

This Example relates to a second embodiment shown in FIGS. 2A and 2B, which are schematic cross-sectional views each showing a part of a semiconductor device, under fabrication, which is provided with a barrier layer of titanium nitride (TiN) and given for explaining the outline of the process for forming a contact. An n-type region 22 doped with impurities was formed in a p-type Si substrate 21 according to a standard method for producing an integrated circuit and then a $TiSi_2$ layer 23 was selectively formed in the surface of the impurity-doped layer 22 through a solid phase reaction of titanium (Ti) with silicon. Thereafter, an insulating film 24 of PSG (phospho-silicate glass, $P_2O_5/SiO_2$ glass) was deposited on the p-type Si substrate 21 inclusive of the n-type impurity-doped layer 22 and the $TiSi_2$ layer 23 according to the CVD method and then contact holes 25 were formed by the photo-etching process. Then a TiN film 26 serving as a barrier layer was deposited on the insulating film 24 including the contact holes 25 by the reactive sputtering process in which Ti was used as a target.

Then the substrate provided thereon with the barrier layer 26 was heated and compressed at a hydrostatic pressure of 200 MPa in a nitrogen gas ambience of 300° C. for one hour using the HIP apparatus. After the heating and compressing process, an Al interconnection pattern 27 was formed on the barrier layer 26 according to a standard method (FIG. 2B). After the formation of the Al interconnection pattern 27 and a heat-treatment of the resulting assembly performed at 500° C. and under atmospheric pressure for 30 minutes, there were evaluated a contact resistance between the Al interconnection 27 and the n-type layer 22 and a reverse-leakage current at the n-p junction between the n-type layer 22 and the p-type Si substrate 21. As a result, it was found that both of these were not more than the required levels respectively. On the other hand, a sample which was not subjected to the above HIP treatment was produced by way of comparison and it was found that the reverse-leakage current at the n-p junction increased and thus defectives were formed.

EXAMPLE 3

Figure 3A:
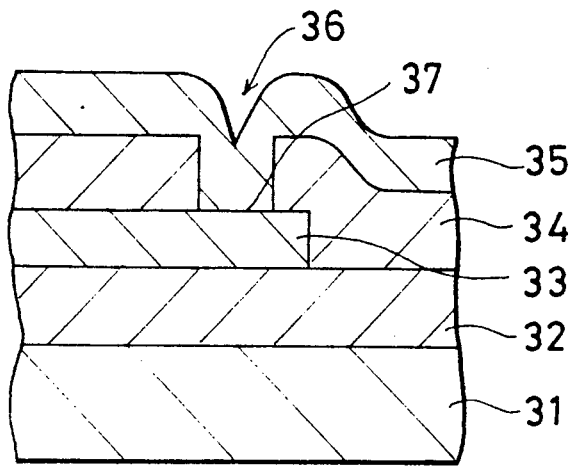
FIGS. 3A and 3B are schematic cross-sectional views each showing a part of a semiconductor device under fabrication and given for explaining the outline of the process for forming Al multilevel interconnections according to a third embodiment of the method of the present invention.
Figure 3B:
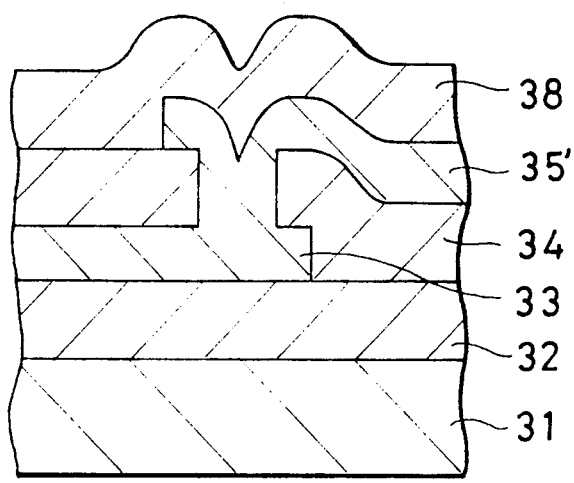

This example relates to a third embodiment shown in FIGS. 3A and 3B, which are schematic cross-sectional views each showing a part of a semiconductor device under fabrication and given for explaining the outline of the process for forming an Al multilevel interconnection. A first insulating film 32 of PSG was first formed on an Si substrate 31 according to a standard method for producing an integrated circuit, then a first Al interconnection pattern 33 was formed thereon and a second insulating film 34 was formed on the upper surface of the first insulating film 32 inclusive of the Al interconnection pattern 33. A through-hole 36 was formed in the second insulating film 34 so that the tip of an opening thereof reached the first Al interconnection pattern 33. A second Al film 35 for forming a second Al interconnection was formed on the upper surface of the second insulating film 34 including the portion of the through-hole 36. The first Al interconnection pattern 33 came in contact with the second Al interconnection portion filled in the through-hole 36 at the interface 37 therebetween (FIG. 3A).

In this Example, after forming the Al film 35 for forming the second Al interconnection on the Si substrate 31, a hydrostatic pressure of 100 MPa was applied to the Si substrate 31 while heating it to 300° C. in an argon ambience using the HIP apparatus (not shown). The heated and compressed Al film 35 was patterned into a pattern 35' for the second-level Al interconnection as shown in FIG. 3B and a third insulating film 38 was deposited onto the patterned second-level interconnection to give a two-level interconnection.

In this Example, the interface 37 between the first-level Al interconnection and the second-level Al interconnection at the bottom of the through-hole 36 was broken by the action of a hydrostatic pressure of the order of 100 MPa and disappeared due to the growth of crystalline grains. Thus, the resistance against stress migration and electromigration at the through-hole was improved. In addition, the density of the Al interconnection films was also improved. Therefore, the resistance of the interconnection against migration was likewise improved.

In the second and third embodiments described above, Al was used as a material for interconnections, but Al-based alloys such as Al-Si and Al-Si-Cu may likewise be used instead.

EXAMPLE 4

Figure 4:
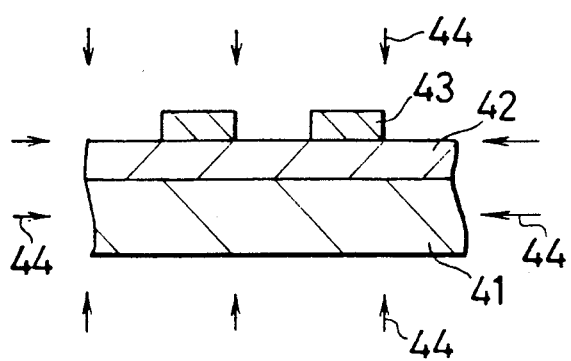
FIG. 4 is a schematic cross-sectional view showing a part of a semiconductor device under fabrication and given for explaining the outline of the process for forming interconnections fabricated with higher density films according to a fourth embodiment of the method of the present invention.

This Example relates to a fourth embodiment shown in FIG. 4, which is a schematic cross-sectional view showing a part of a semiconductor device under fabrication and given for explaining the outline of the process for forming a densified Al interconnection. An insulating film 42 was formed on the surface of a substrate 41 and then a pattern 43 for Al interconnections was formed on the insulating film 42 according to a standard method for fabricating an integrated circuit. Thereafter, the substrate 41 provided thereon with the insulating film 42 and the pattern 43 was subjected to HIP treatment carried out at a hydrostatic pressure equal to 200 MPa in an argon ambience and at 400° C. using an HIP apparatus (not shown), and then the HIP-treated interconnections were covered with a passivation film of $SiN_x$ (not shown) according to a standard method.

The resulting assembly was subjected to the high temperature stress migration test in order to inspect the interconnections for the formation of voids by heating the assembly to a temperature ranging from 450° to 500° C. and under an atmospheric pressure for 30 minutes, then allowed to cool. As a result, only a small number of voids were observed in the interconnections.

EXAMPLE 5

Figure 5:
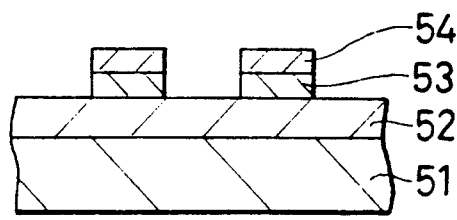
FIG. 5 is a schematic cross-sectional view showing a part of a semiconductor device under fabrication and given for explaining the outline of the process for forming a polycide interconnections and electrodes which have a two-layered structure comprising a tungsten silicide layer and a polycrystalline silicon layer according to a fifth embodiment of the method of the present invention.

This Example relates to a fifth embodiment shown in FIG. 5, which is a schematic cross-sectional view showing a part of a semiconductor device under fabrication and given for explaining the outline of the process for forming a polycide interconnection or gate which has a two-layered structure comprising a tungsten silicide layer and a polycrystalline silicon layer. An insulating film 52 of PSG was deposited on the upper surface of an Si substrate 51 by the CVD process. A film 53 of polycrystalline silicon for forming interconnections was formed on the upper surface of the PSG insulating film by the CVD process, a film 54 of tungsten silicide for forming interconnections was then formed on the polycrystalline silicon film 53 by the sputtering process and these films were patterned into a desired pattern to give polycide interconnections and gates. Thereafter, the Si substrate 51 provided thereon with the polycide interconnections was subjected to HIP treatment carried out at a hydrostatic pressure equal to 200 MPa for one hour in an argon ambience maintained at 300° C. using the HIP apparatus. Then it was heat-treated at 900° C. and under atmospheric pressure for 30 minutes and a passivation film of each of PSG, BPSG, $SiO_2$, SiON and $SiN_x$ films was applied thereto (not shown) to give five assemblies.

The polycide interconnection formed in this Example was not peeled off or delaminated at all during the heat-treatment at 900° C. even when the interconnection comprised a pattern having a wide area. However, there was observed delaminating of the pattern having a wide area in the polycide interconnection formed according to a conventional method in which the HIP treatment was not carried out.

EXAMPLE 6

Figure 6A:
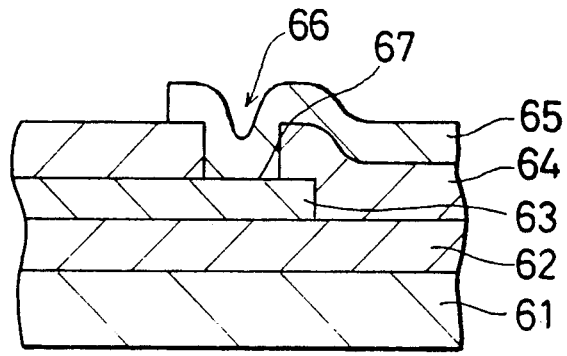
FIGS. 6A and 6B are schematic cross-sectional views each showing a part of a semiconductor device under fabrication and given for explaining the outline of the process for forming Al multilevel interconnections according to a sixth embodiment of the method of the present invention.
Figure 6B:
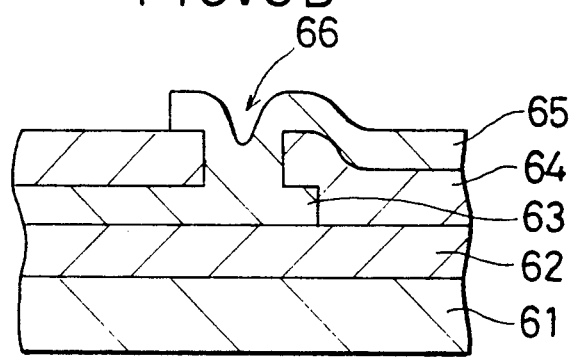

This Example relates to a sixth embodiment shown in FIGS. 6A and 6B, which are schematic cross-sectional views each showing a part of a semiconductor device under fabrication and given for explaining the outline of the process for forming an Al multilevel interconnection. According to a standard method for fabricating an integrated circuit, a first insulating film 62 of PSG was first formed on an Si substrate 61, then a first-level Al interconnection pattern 63 was formed on the upper surface of the first insulating film 62 and a second insulating film 64 was formed on the upper surface of the first insulating film 62 inclusive of the first-level Al interconnection pattern 63. A through-hole 66 was formed in the second insulating film 64 so that the tip of an opening thereof reached the first-level Al interconnection pattern 63. A second-level Al interconnection pattern 65 was formed on the upper surface of the second insulating film 64 including the portion of the through-hole 66. The first-level Al interconnection pattern 63 came in contact with the second-level Al interconnection portion filled in the through-hole 66 at the interface 67 therebetween (FIG. 6A).

In this Example, after forming the pattern of the second-level Al interconnection 65 on the Si substrate 61, a hydrostatic pressure of 200 MPa was applied to the Si substrate 61 while heating it to 300° C. in an argon ambience using the HIP apparatus (not shown). As shown in FIG. 6B, the interface 67 existing between the first-level Al interconnection 63 and the second-level Al interconnection 65 surely disappeared due to the growth of the crystalline grains. Then a passivation film of each of PSG, BPSG, $SiO_2$, SiON and $SiN_x$ films was applied thereto (not shown) to give five products.

In the device produced by a conventional method, the interface 67 formed between the first-level Al interconnection 63 and the second-level Al interconnection 65 was not always disappeared and became a cause of stress migration and electomigration at the through-hole part, but in this embodiment, the interface 67 disappeared as mentioned above and, therefore, the resistance against stress migration and electromigration at the through-hole is greatly improved. In addition, the density of the Al interconnection was also improved and the stability of the surface thereof was likewise improved. The resistance of the interconnection to migration was accordingly improved.

EXAMPLE 7

Figure 7:
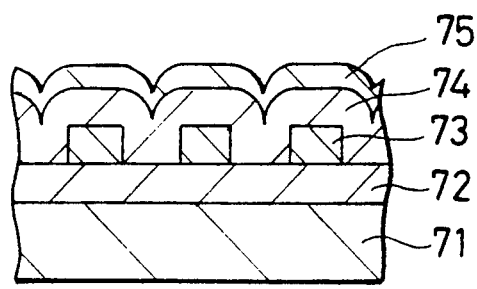
FIG. 7 is a schematic cross-sectional view showing a part of a semiconductor device under fabrication and given for explaining the outline of the process for forming PSG and silicon nitride insulating films on an Al interconnection according to a seventh embodiment of the method of the present invention.

This Example relates to a seventh embodiment shown in FIG. 7, which is a schematic cross-sectional view showing a part of a semiconductor device under fabrication and given for explaining the outline of the process for forming PSG and silicon nitride insulating films on an Al interconnection. A silicon oxide film 72 as an insulating film was deposited on a silicon substrate 71 by the CVD method and an Al interconnection 73 was formed thereon. Then a PSG film 74 as a passivation film was deposited on the silicon oxide film 72 including the Al interconnection 73 by the CVD method. The silicon substrate 71 on which the silicon oxide film 72, the Al interconnection 73 and the PSG film 74 as the passivation film had been formed was HIP-treated at 400° C. for one hour in an argon gas ambience under a hydrostatic pressure of 200 MPa. Then an $SiN_x$ film 75 as another passivation film was deposited on this HIP-treated PSG film 74 by the plasma-enhanced CVD method. Thereafter, the substrate was heat-treated at 475° C. for 30 minutes under atmospheric pressures to evaluate the rate of void-formation due to the stress migration. The Al interconnection of this embodiment showed no void-formation. Thus, the method of the present invention could provide interconnection having very high reliability.

On the contrary, a lot of voids were formed due to the stress migration in the Al interconnections produced by a conventional method in which the application of hydrostatic pressure was not performed.

In this embodiment, the interconnection was formed from Al, but it can be formed from Al-based alloys such as Al-Si and Al-Si-Cu alloys. In addition, PSG and $SiN_x$ were used as an insulating material for the passivation film, but it is also possible to use other materials such as BPSG, $SiO_2$ and SiON.

Next, the above seventh embodiment will be explained in more detail with reference to the following concrete example but the embodiment is by no means limited to following specific example and description.

An $SiO_2$ insulating film having a thickness of 0.5 $\mu$m was formed on an Si substrate through the CVD method, then an Al interconnection layer having a thickness of 0.5 $\mu$m was deposited on the insulating film and the Al interconnection layer was formed into a desired pattern to give an Al interconnection. Then a PSG film of 0.3 $\mu$m thick was deposited on the whole surface of the $SiO_2$ insulating film including the Al interconnection by the CVD method. The substrate provided thereon with the PSG film was subjected to an HIP treatment. The conditions for this treatment were a pressure of 200 MPa, a heating temperature of 400° C. and a heating time of one hour in an argon gas ambience.

In this Example, four kinds of Al interconnections were formed and each had a length of 70 $\mu$m and a width of 1.05, 1.4, 2.1 or 4.2 $\mu$m. Nine interconnections were formed for each kind of Al interconnections.

After the HIP-treatment, an $SiN_x$ film was deposited thereon by the plasma-enhanced VCD method. Then the stress migration test was carried out. This test comprised annealing the sample at temperatures of 450°, 500° and 550° C. for 30 minutes in a nitrogen gas ambience. As a result, no void was observed irrespective of the width of the interconnection and the annealing temperature.

EXAMPLE 8

The same procedures used in Example 7 were repeated till the PSG film 74 as a passivation film was formed on the substrate 71 with the silicon oxide film 72 and the Al interconnection 73 formed thereon. In this Example, immediately thereafter, the $SiN_x$ film 75 as another passivation film was deposited on the PSG film 74 through the plasma-enhanced CVD method.

After the deposition of the $SiN_x$ film 75, the silicon substrate 11 was compressed at 400° C. for one hour in an argon gas ambience under a hydrostatic pressure of 200 MPa using the HIP apparatus, as in Example 7.

In this Example, the substrate was likewise heat-treated at 475° C. for 30 minutes under atmospheric pressure to evaluate the rate of void-formation due to stress migration. The Al interconnection of this embodiment showed an extremely low rate of void-formation as compared with that produced by the conventional method as discussed in Example 7. Thus, the method of the present invention could provide interconnection having very high reliability.

According to the method of the present invention, a metal film is deposited on an insulating film formed on a substrate or interconnections or electrodes are formed thereon, and then the deposited metal film or the interconnections or electrodes formed are compressed by the application of a hydrostatic pressure exceeding atmospheric pressure. Accordingly, the method of the present invention makes it possible to produce high-quality interconnections or electrodes for semiconductor devices in a high yield as compared with those formed according to the conventional method in which the HIP treatment was not carried out.

Moreover, according to the present invention, a passivation film such as a protective film or an insulating film is applied onto an electrode or interconnection pattern formed on a substrate with an insulating film and then the whole substrate provided thereon with the passivation film is compressed by the application of a hydrostatic pressure exceeding atmospheric pressure. Accordingly, the interconnections and electrodes for semiconductor devices formed according to the present invention have high density and good adhesion as well as high reliability and quality as compared with those produced by the conventional method.

As has been discussed above in detail, the method of the present invention makes it possible to improve density and adhesion of metal films for forming interconnections or electrodes and insulating films as well and thus to fabricate semiconductor devices equipped with high-quality electrodes and interconnections at a relatively low cost as compared with the conventional method for fabricating semiconductor devices.

What is claimed is:

1. A method for fabricating a semiconductor device comprising the steps of depositing a metal film for forming interconnections or electrodes on an insulating film formed on a substrate and then applying a hydrostatic pressure exceeding atmospheric pressure to the surface of the deposited metal film to adhere said metal film to said insulating film.

2. The method of claim 1 wherein said deposited metal film is formed into patterns for interconnections or electrodes.

3. The method of claim 1 wherein said hydrostatic pressure is not less than 100 MPa.

4. The method of claim 1 wherein said metal film is formed from a member selected from the group consisting of silicon, aluminum, chromium, copper, platinum, gold, titanium, zirconium, molybdenum, tungsten, tantalum and alloys thereof; silicides of titanium, zirconium, hafnium, vanadium, tantalum, chromium, molybdenum, tungsten, iron, cobalt, nickel, platinum and palladium; and any combination of at least two of them.

5. The method of claim 1 wherein said semiconductor device comprises a plurality of interconnection layers, and said plurality of interconnection layers are first formed and then said hydrostatic pressure is applied to the resulting assembly.

6. The method of claim 1 wherein said semiconductor device comprises a plurality of interconnection layers and said hydrostatic pressure is applied every time when a metal film or a pattern of an interconnection or an electrode in one or some of said plurality of interconnection layers is formed.

7. The method of claim 1 wherein said semiconductor device comprises a plurality of interconnection layers and the application of said hydrostatic pressure is performed every time when said insulating film is formed on said metal film or patterns of interconnections or those of electrode which are formed by patterning said metal film.

8. The method of claim 1 wherein the application of said hydrostatic pressure is performed in a pressure medium selected from the group consisting of gases and liquids.

9. The method of claim 8 wherein said hydrostatic pressure is not less than 100 MPa and the pressure medium is argon gas, nitrogen gas, oxygen gas, or a mixture of these gases.

10. The method of claim 1 wherein the application of said hydrostatic pressure is first started and then heating is started during the course of pressing or after increasing the pressure up to a desired level.

11. A method for fabricating a semiconductor device comprising the steps of forming a passivation film on a metal film for forming interconnections or electrodes, which is formed on a substrate with an insulating film, and then applying a hydrostatic pressure exceeding atmospheric pressure to the surface of said passivation film formed to adhere said passivation film and said insulating film to said metal film.

12. The method of claim 11 wherein said metal film is formed into patterns for interconnections or electrodes.

13. The method of claim 11 wherein the hydrostatic pressure is not less than 100 MPa.

14. The method of claim 11 wherein said metal film is formed from a member selected from the group consisting of silicon, aluminum, chromium copper, platinum, gold, titanium, zirconium, molybdenum, tungsten, tantalum and alloys thereof; silicides of titanium, zirconium, hafnium, vanadium, tantalum, chromium, molybdenum, tungsten, iron, cobalt, nickel, platinum and palladium; and any combination of at least two of them.

15. The method of claim 11 wherein said semiconductor device comprises a plurality of interconnection layers, and said plurality of interconnection layers are first formed and then said hydrostatic pressure is applied to the resulting assembly.

16. The method of claim 11 wherein said semiconductor device comprises a plurality of interconnection layers and said hydrostatic pressure is applied every time when a metal film or a pattern of an interconnection or an electrode in one or some of said plurality of interconnection layers is formed.

17. The method of claim 11 wherein said semiconductor device comprises a plurality of interconnection layers and the application of said hydrostatic pressure is performed every time when said insulating film is formed on said metal film or patterns of interconnections or those of electrodes which are formed by patterning said metal film.

18. The method of claim 11 wherein the application of said hydrostatic pressure is performed in a pressure medium selected from the group consisting of gases and liquid.

19. The method of claim 18 wherein said hydrostatic pressure is not less than 100 MPa and said pressure medium is argon gas, nitrogen gas, oxygen gas or a mixture of these gases.

20. The method of claim 11 wherein the application of said hydrostatic pressure is first started and then heating is started during the course of pressing or after increasing the pressure up to a desired level.

21. A method for fabricating a semiconductor device comprising the steps of depositing an insulating film on a substrate, depositing an Al interconnection layer on said insulating film and patterning said Al layer to give an Al interconnection having a desired pattern, depositing a PSG film as a passivation film on said insulating film including said Al interconnection, then applying a hydrostatic pressure exceeding atmospheric pressure to the resulting assembly to adhere said PSG film and said insulating film to said Al interconnection, and thereafter depositing an $SiN_x$ film, where X is an integer, as another passivation film on the heat-treated PSG film.

* * * * *